(12) United States Patent
Fonash (10) Patent No.: US 10,991,839 B2
(45) Date of Patent: Apr. 27, 2021

(54) SOLAR CELL METAL-LESS REFLECTOR / BACK ELECTRODE STRUCTURE

(71) Applicant: Stephen J. Fonash, State College, PA (US)

(72) Inventor: Stephen J. Fonash, State College, PA (US)

( * ) Notice: Subject to any disclaimer, the term of this patent is extended or adjusted under 35 U.S.C. 154(b) by 0 days.

(21) Appl. No.: 15/223,545

(22) Filed: Jul. 29, 2016

(65) Prior Publication Data

US 2017/0033244 A1    Feb. 2, 2017

Related U.S. Application Data

(60) Provisional application No. 62/198,136, filed on Jul. 29, 2015, provisional application No. 62/210,848, filed on Aug. 27, 2015.

(51) Int. Cl.
*H01L 31/056*    (2014.01)
*H01L 31/0224*    (2006.01)
(Continued)

(52) U.S. Cl.
CPC .... *H01L 31/056* (2014.12); *H01L 31/022425* (2013.01); *H01L 31/035281* (2013.01);
(Continued)

(58) Field of Classification Search
CPC ....... H01L 31/035281; H01L 31/03529; H01L 31/056; H01L 31/02366; H01L 31/02363;
(Continued)

(56) References Cited

U.S. PATENT DOCUMENTS 8,216,872 B1 *    7/2012    Shieh ................ H01L 31/02168
                                                        438/69
2005/0022860 A1    2/2005    Toh
(Continued)

FOREIGN PATENT DOCUMENTS

WO    WO-2013048577 A1 *    4/2013    ....... H01L 31/02366

OTHER PUBLICATIONS

Sheppard, C.J.R, "Approximate calculation of the reflection coefficient from a stratified medium", Pure and Applied Optics: Journal of the European Optical Society Part A (1995), pp. 665-669, vol. 4, Issue 5, Copyright IOP Publishing Ltd. (1995).
(Continued)

*Primary Examiner* — Andrew J Golden
(74) *Attorney, Agent, or Firm* — Blue Filament Law PLLC (57) ABSTRACT

A photovoltaic or light detecting device is provided that includes a periodic array of dome or dome-like protrusions at the light impingement surface and a metal-less reflector/back electrode at the device back. The beneficial interaction between an appropriately designed top protrusion array and metal-less reflector/electrode back contact (R/EBC) serves (1) to refract the incoming light thereby providing photons with an advantageous larger momentum component parallel to the plane of the back (R/EBC) contact and (2) to provide optical impedance matching for the short wavelength incoming light. The metal-less reflector/back electrode operates as a back light reflector and counter electrode to the periodic array of dome or dome-like structures. A substrate supports the metal-less reflector/back electrode.

14 Claims, 5 Drawing Sheets

(51) Int. Cl.
*H01L 31/0352* (2006.01)
*H01L 31/0392* (2006.01)
*H01L 31/0236* (2006.01)

(52) U.S. Cl.
CPC .. *H01L 31/0236* (2013.01); *H01L 31/022466* (2013.01); *H01L 31/0392* (2013.01); *Y02E 10/52* (2013.01)

(58) Field of Classification Search
CPC ....... H01L 31/035227; H01L 31/03928; H01L 31/022441; H01L 31/022433; H01L 31/02245; H01L 31/022466; H01L 31/0392; H01L 31/0236
USPC .................................................. 136/243–265
See application file for complete search history.

(56) References Cited

U.S. PATENT DOCUMENTS

| | | | |
|---|---|---|---|
| 2005/0172997 A1* | 8/2005 | Meier | H01L 31/056 136/261 |
| 2008/0223436 A1* | 9/2008 | den Boer | H01L 31/056 136/256 |
| 2009/0293934 A1 | 12/2009 | Okada et al. | |
| 2010/0096012 A1* | 4/2010 | Straub | H01L 31/03685 136/259 |
| 2010/0206362 A1* | 8/2010 | Flood | H01L 31/0336 136/252 |
| 2010/0243042 A1* | 9/2010 | Shan | H01L 31/056 136/255 |
| 2011/0048499 A1* | 3/2011 | Myong | H01L 31/076 136/246 |
| 2011/0186119 A1* | 8/2011 | Atwater | H01L 31/0232 136/256 |
| 2011/0259398 A1* | 10/2011 | Kim | H01L 31/022466 136/246 |
| 2011/0259419 A1* | 10/2011 | Hagemann | H01L 31/056 136/259 |
| 2011/0277827 A1* | 11/2011 | Yang | H01L 31/035281 136/255 |
| 2011/0308586 A1* | 12/2011 | Yamazaki | H01L 31/0236 136/255 |
| 2012/0125437 A1* | 5/2012 | Okawara | H01L 31/0481 136/259 |
| 2012/0240999 A1* | 9/2012 | Yoshida | H01L 31/02366 136/256 |
| 2013/0092210 A1* | 4/2013 | Fonash | H01L 31/022425 136/244 |
| 2013/0092229 A1* | 4/2013 | Xue | H01L 31/0392 136/256 |
| 2013/0112236 A1* | 5/2013 | Bhan | H01L 31/035281 136/246 |
| 2013/0192663 A1* | 8/2013 | Fonash | H01L 31/02363 136/246 |
| 2013/0220406 A1* | 8/2013 | Day | H01L 31/035281 136/255 |
| 2014/0252313 A1* | 9/2014 | Mariani | H01L 31/035227 257/21 |
| 2014/0261612 A1* | 9/2014 | Smith | H01L 31/035281 136/244 |

OTHER PUBLICATIONS

Haug, F.J. et al., "Influence of the ZnO buffer on the guided mode structure in Si/ZnO/Ag multilayers", Journal of Applied Physics, Sep. 2009 (Published Online: Aug. 19, 2009), pp. 044502-1-044502-7, vol. 106, Copyright American Institute of Physics (2009).

Fonash, Stephen, "Solar Cell Device Physics; 2nd Edition", Published Apr. 13, 2010, Copyright Academic Press and Elsevier Inc. (2010).

Ferry, V.E., Polman, A., Atwater, H.A., "Modeling Light Trapping in Nanostructured Solar Cells", ACS Nano, Dec. 27, 2011 (Published Online: Nov. 14, 2011), pp. 10055-10064, vol. 5, Issue 12, Copyright American Chemical Society (2011).

Nam, Wook Jun et al., "Exploration of nano-element array architectures for substrate solar cells using an a-Si:H absorber", Journal of Applied Physics, Published Online: Jun. 19, 2012, pp. 123103-1-123103-6, vol. 111, Copyright American Institute of Physics (2012).

Kim, Jeehwan et al., "9.4% Efficient Amorphous Silicon Solar Cell on High Aspect-Ratio Glass Microcones", Advanced Materials, Jun. 25, 2014 (Published Online: Mar. 20, 2014), pp. 4082-4086, vol. 26, Issue 24, Copyright Wiley-VCH Verlag GmbH & Co. KGaA, Weinheim (2014).

\* cited by examiner

SOLAR CELL METAL-LESS REFLECTOR / BACK ELECTRODE STRUCTURE

RELATED APPLICATIONS

This application is a non-provisional application that claims priority benefit of U.S. Provisional Application Ser. No. 62/198,136 filed Jul. 29, 2015; and. U.S. Provisional Application Ser. No. 62/210,848 filed Aug. 27, 2015; the content of both of which are hereby incorporated by reference.

FIELD OF THE INVENTION

The present invention relates in general to photovoltaic (e.g., solar cell) or light detecting devices and in particular to a reflector/back electrode structure that is free of a metal layer performing an optical reflector function thereby affording superior performance as measured by effectiveness, cost, or both.

BACKGROUND OF THE INVENTION

Solar cells traditionally have resorted to structures having a metal layer(s) normally used in back reflector/electrode structures to serve in both electrical conduction and optical roles (1). Metals have the advantage of being able to serve as both reflector and conducting back electrode. Because of its excellent reflectivity, conductivity, and chemical properties, silver is usually the metal of choice for the reflector/electrode back contact (R/EBC) use. However, its cost can be a factor, especially in large device area applications such as solar cells. The processing step needed to apply a back reflector/electrode metal can also be time-consuming and costly, especially if it involves vacuum deposition. In these devices effectiveness as well as materials and manufacturing costs, or both are factors to be considered. The back reflector/electrode structure that would be very useful is one that would not degrade performance to any significant extent, if at all, when utilized and yet would avoid the use of a metal thereby being beneficial by mitigating device cost considerations, removing metal chemical reactivity considerations, removing plasmonic loss possibilities (2-4), and simplifying processing. Thus, there exists a need for a solar cell architecture that is free of a metal layer performing an optical reflector function.

In recent work, Kim et al. (4) used a 200 nm ZnO:Al back contact for a superstrate a Si:H thin film solar cell on glass microcone features on a glass substrate. Here the notation ZnO:Al represents Al doped ZnO (commonly denoted as AZO). The microcones with a base diameter d~1.5 µm were formed by employing a hard mask on, and then reactive ion etching (RIE), the glass substrate. These randomly positioned microcones were reported to have an aspect ratio A~2 where this aspect ratio for microcones was defined as A=h/d, where h is the microcone height and d is its base dimension. Kim et al. termed A=h/d≥2 a high aspect ratio and their A~2 microcones to be 3-D features (4). To explore increasing the performance of these superstrate cells, Kim et al added a back-reflector (BR) on the back of their solar cells. This BR was of the form of a ZnO:Al/Ag BR for some cells and of the form ZnO:Al/TiO BR for others. In this latter BR case, the TiO was in the form of nanoparticles. Performance of the ZnO:Al/Ag BR and ZnO:Al/(nanoparticle) TiO BR structures was compared to what they termed the "none BR ZnO:Al [AZO] back contact". It was found that the ZnO:Al/(nanoparticle) TiO BR structure performed the best and the "none BR ZnO:Al [AZO] back contact" was the next best. Devices with the ZnO:Al/(nanoparticle) TiO BR were reported to give about 5% more short circuit current than the none BR ZnO:Al [AZO] back contact (4).

SUMMARY OF THE INVENTION

A photovoltaic or light detecting device is provided that includes a periodic array of dome or dome-like protrusions at the light impingement surface and a metal-less reflector/back electrode at the device back. The beneficial interaction between an appropriately designed top protrusion array and metal-less reflector/electrode back contact (R/EBC) serves (1) to refract the incoming light thereby providing photons with an advantageous larger momentum component parallel to the plane of the back (R/EBC) contact and (2) to provide optical impedance matching for the short wavelength incoming light. The metal-less reflector/back electrode operates as a back light reflector and counter electrode to the periodic array of dome or dome-like structures. A substrate supports the metal-less reflector/back electrode.

BRIEF DESCRIPTION OF THE DRAWINGS

The present invention is further detailed with respect to the following drawings. These drawings are not intended to limit the scope of the appended claims, but rather to illustrate specific embodiments thereof.

DESCRIPTION OF THE PREFERRED EMBODIMENTS

The following detailed description is merely exemplary in nature and is in no way intended to limit the scope of the invention, its application, or uses, which may vary. The invention is described with relation to the non-limiting definitions and terminology included herein. These definitions and terminology are not designed to function as a limitation on the scope or practice of the invention, but are presented for illustrative and descriptive purposes only.

Various terms used throughout the specification and claims are defined as set forth below as it may be helpful to an understanding of the invention.

A metal-less back reflector/electrode for photovoltaic and light detection devices of the substrate configuration based on transparent conductive materials (TCMs) is disclosed.

As used herein, "metal-less" back reflector-electrode or equivalently "metal-less" reflector-electrode back contact (R/EBC) denotes a structure wherein the one or more layers of this back reflector-electrode contact structure is devoid of any metal film having an optical function. The metal layer(s) normally used in back reflector/electrode structures for their optical role is (are) simply not present in the invention. A metal may lie behind a metal-less R/EBC in various configurations of this invention but, if present, it has no required optical function and serves only as a structural support and perhaps an electrical conduit (i.e., contact or interconnect, or both). Exemplary of metal films in conventional metal R/EBCs is an Ag layer which has reflecting and electrode functions and is often employed in such structures.

The phrase "front surface of a photovoltaic or light detecting device" denotes the air/device region where incoming light first impinges. Correspondingly, the other side of the device is being denoted as the back surface. These definitions apply to both superstrate and substrate device configurations. In conventional devices, the back surface region is often designed to reflect impinging light back through the device to enhance its utilization. Bragg reflectors with their layers of non-conducting dielectrics can be used for back reflectors (1). However, metals are most commonly utilized.

The phrase "dome-like" denotes an aspect protruding above a top planar surface, relative to a direction of light impingement, each protrusion is centered over a nano-element having a conical, pyramidal, cylindrical, or other shaped aspect, which in conjunction with the deposition technique employed (e.g., PECVD), controls the shape of the protrusion layers.

In the invention disclosed herein, a metal-less back reflector/electrode for photovoltaic and detection devices of the substrate configuration based on transparent conductive materials (TCMs) is utilized for its optical coupling to the protrusions without suffering plasmonic losses. The fabrication of this metal-less back reflector/electrode for a substrate device does not use the steps of hard mask deposition and etching of Kim et al. and it is not limited to the glass substrates of Kim et al. Uniquely, the invention reported here employs periodically arrayed dome or dome-like layered protrusions which are positioned at the front surface (FIGS. 1a, 1b) and layered as schematically indicated in FIG. 2 in a cross-sectional view. The resulting refraction of impinging light redirects that light as seen in FIG. 2. This redirection is due to the shape of the dome or dome-like protrusions as seen in FIG. 2 and the variation of the indices of refraction of its layers. The shape requirement for the layers of a protrusion for beneficial redirection properties may be quantified by employing the (normalized) surface normal vector $\hat{n}$ at two successive surface points along a ray path; i.e., points 1 and 2 of FIG. 2. The shape requirement for any two successive layers in a protrusion can then be stated as: the horizontal component of the normalized surface normal vector at point 2 must be equal to or larger than the horizontal component of the normalized surface normal vector at point 1. The horizontal direction is defined by the "back plane" in FIGS. 1 (a)-(d). Layer indices of refraction must increase or at least remain constant as the impinging light penetrates deeper into the photovoltaic or light detecting device. The objective of this protrusion orientation being away from the device (FIG. 1), the protrusion topology, and the varying indices of refraction is to increase the component of the impinging photon momentum parallel to the planar region (defined by the back plane) of the back electrode depicted in FIGS. 1(a)-1(d).

The fabrication of this metal-less back reflector/electrode for a substrate device does not use steps such as hard mask deposition and etching and it is not limited to the use of glass substrates. As noted, the invention reported here employs "dome protrusions" or "dome-like protrusions" which are positioned at the front surface as schematically indicated in FIGS. 1(a) and 1(b) cross-sections, FIG. 1(c) planar view, and in FIG. 1(d) perspective views.

These protrusions may include multiple layers, one or more of which may be the top electrode (a TCM). In particular, the protrusion may be covered by the top electrode as in FIGS. 1(a) and 1(b). These protrusions may include multiple layers, one or more of which may be part of the active region, as seen in FIG. 1 (a). The active region includes at least one of the absorber(s) and built-in electrostatic and/or effective field forming layers (1. Layer indices of refraction n must increase or at least remain constant as the impinging light penetrates deeper through protrusion layers. In the case where the active region has an active layer top surface that is at least partially in the protrusion, as seen in FIG. 1 (a), the terminal protrusion layer before the active region has an n less than or essentially equal to that of the active region being encountered. In the case where the active layer top surface is not in the protrusion but is planar with the protrusions disposed thereon, as seen in FIG. 1(b), the terminal protrusion layer before the active region has an n larger or essentially equal to than that of the active region being encountered.

Figure 1A:
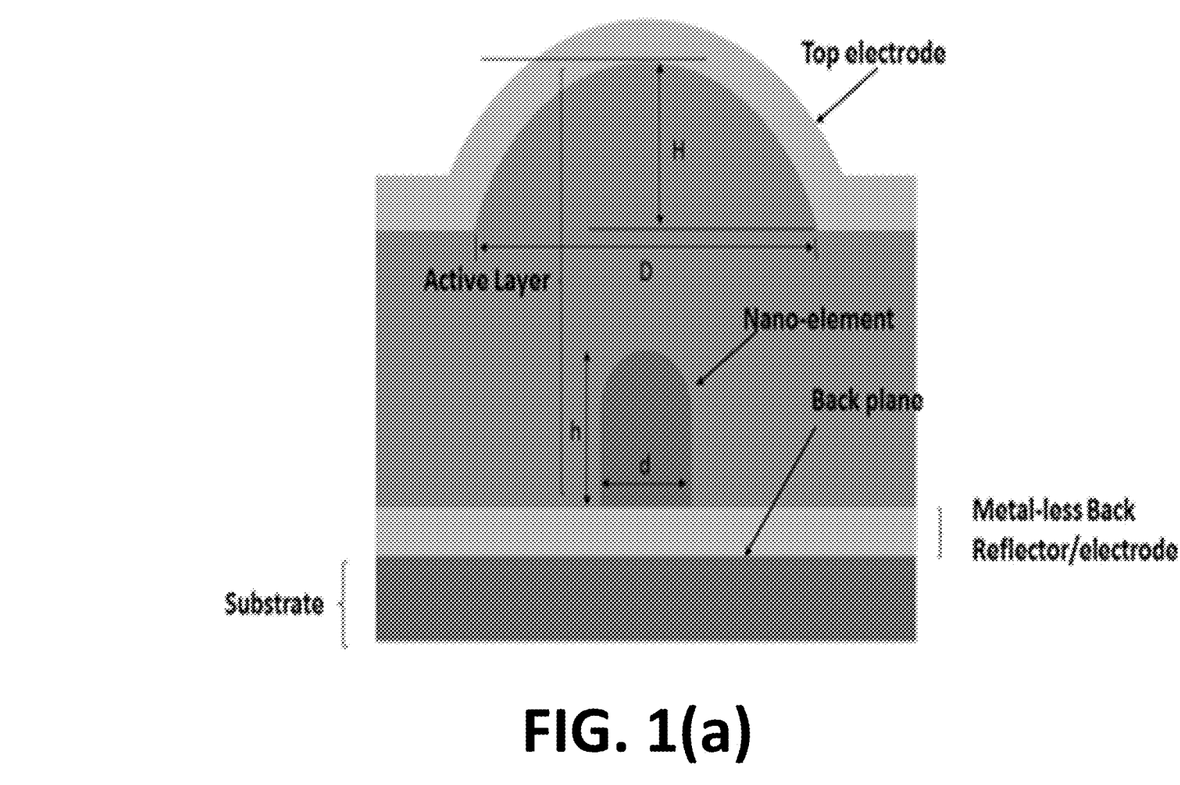
FIG. 1(a) is a schematic cross-sectional view of an inventive embodiment in which nanoelements underlying each one of a periodic array of dome or dome-like protrusions are embedded within an active layer.
Figure 1B:
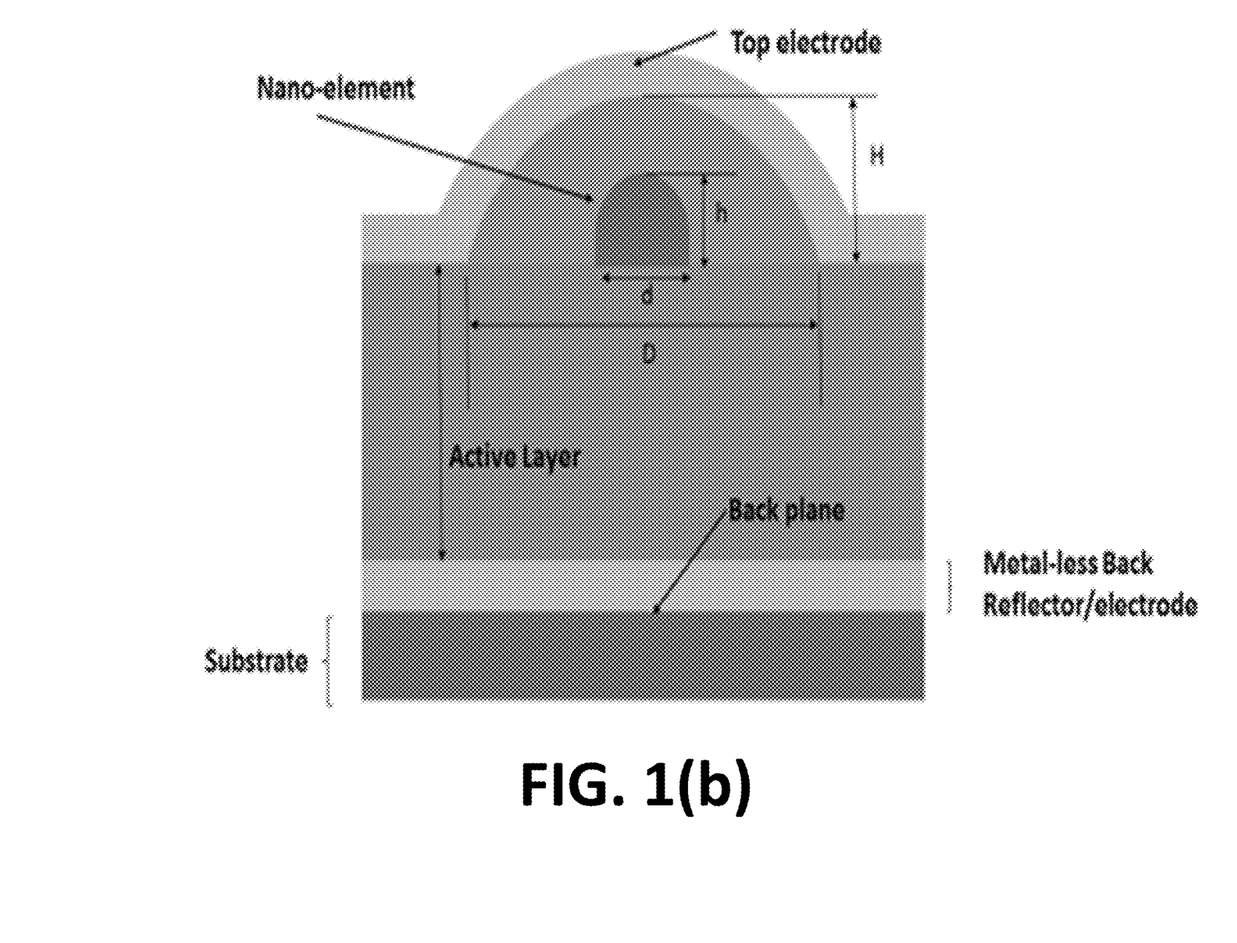
FIG. 1(b) is a schematic cross-sectional view of an inventive embodiment in which nanoelements underlying each one of a periodic array of dome or dome-like protrusions is positioned on top of an active layer.
Figure 1C:
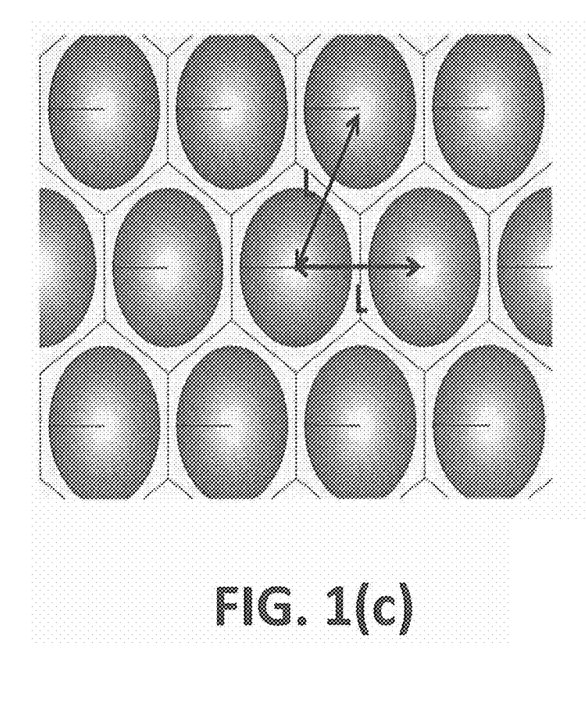
FIG. 1(c) is a planar view of the top electrode surface of the periodic array of dome or dome-like protrusions of either of the aforementioned drawings with no attempt made to depict an optimized flat area among domes.
Figure 1D:
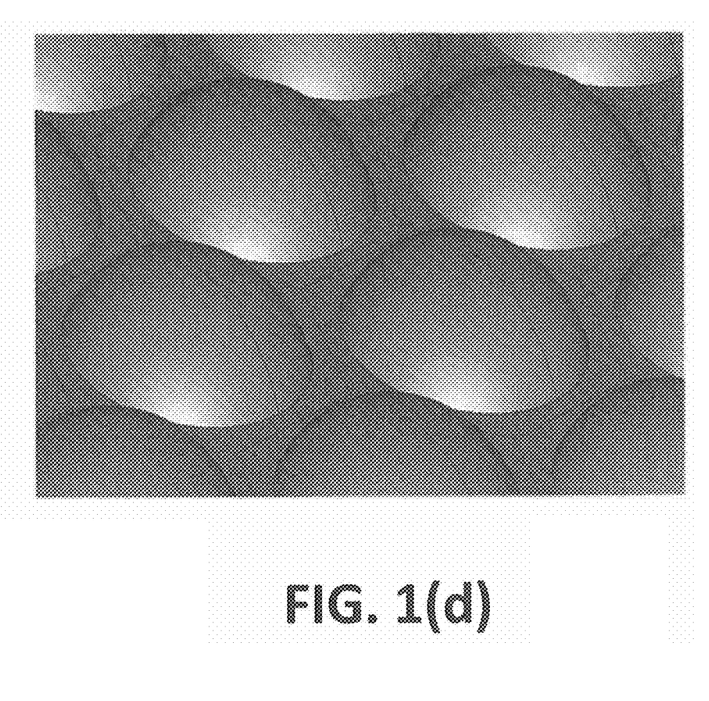
FIG. 1(d) is a perspective view of the top electrode surface of the periodic array of dome or dome-like protrusions either FIG. 1(a) or FIG. 1(b) with no attempt made to depict an optimized flat area among domes.
Figure 2:
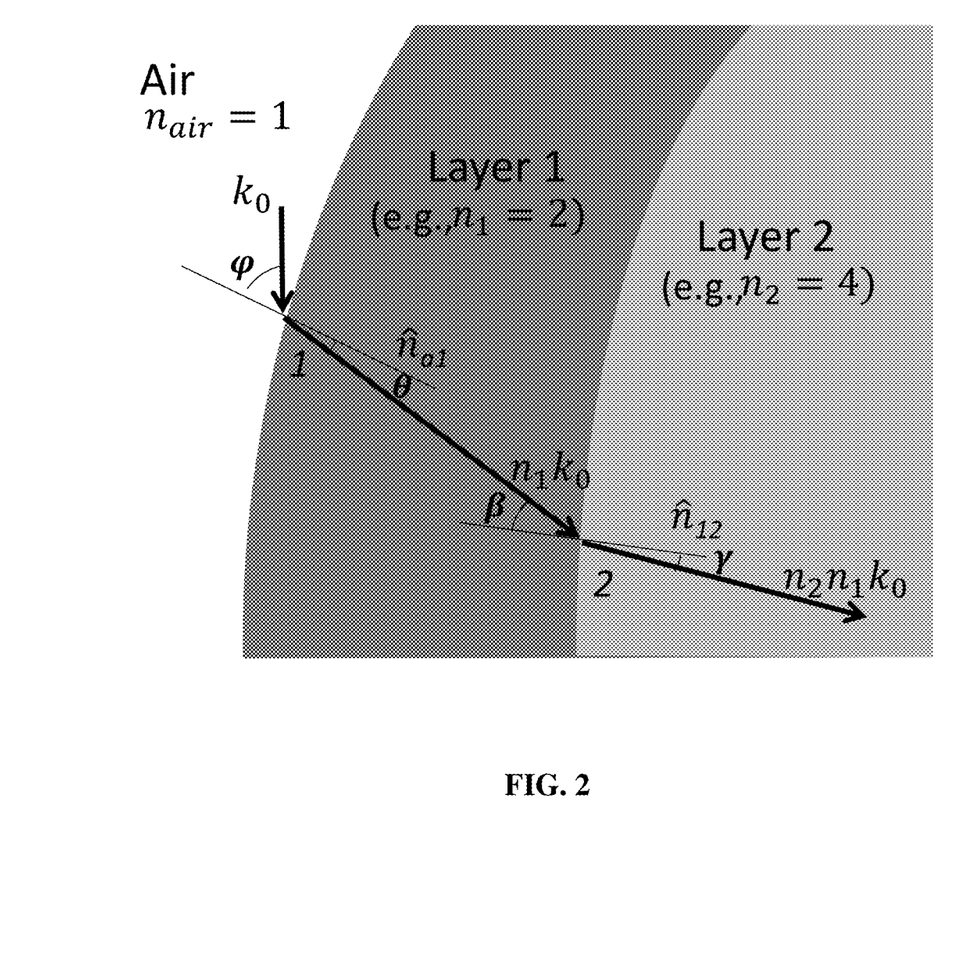
FIG. 2 is a close up of a portion of two successive interfaces in a dome or dome-like protrusion as depicted in the aforementioned drawings, with refraction indices of materials selected to induce an incident photon redirection.

The objective of having protrusion orientation pointing away from the device (FIGS. 1(a) and 1(b), the protrusion topology, and the varying indices of refraction is to increase or at least maintain the component of the impinging photon momentum parallel to the back plane depicted in FIGS. 1(a) and 1(b); i.e., to increase the parallelity to the back contact of the impinging photon momenta.

Broadly speaking choosing a dome or dome-like protrusion base dimension D, height H, and spacing L shown in FIGS. 1(a)-1(d), as well as the resulting aspect ratio A=H/D affects the efficacy of the momentum change function of these protrusions. Choosing these aspects of the topology as well as the layer by layer n variation and the amount of front surface covered by the protrusion base affects the impact of these characteristics on increasing the component of the impinging photon momentum parallel to the back plane (denoted in FIGS. 1(a)-1(d)). For a given D, the protrusion surface area should be made as large as possible and the amount of the front surface area not covered by protrusions (See FIGS. 1(c) and 1(d) should be made as small as possible subject to processing and economic constraints. For example, using uniform domes or dome-like protrusions of base dimension D which just touch in a hexagonal periodic pattern of spacing L will produce a protrusion covered front surface percentage of 90%. This is not achieved in FIGS. 1(c) and 1(d), for drawing clarity.

To function, the metal-less back reflector/back electrode structure of the invention disclosed herein requires refracting dome or dome-like structures with the properties described and oriented to protrude away from the R/EBC as seen in FIGS. 1(a)-1(d). The inventive metal-less reflector/ back electrode back contacts of this invention do not necessitate an aspect ratio A such that A≥2 and therefore mitigate against the possibility of performance degradation due to sharp features. The important dimensions of the inventive metal-less reflector/electrode back contacts are the D, H, and L of the dome or dome-like protrusions; they define the topological features shown in FIGS. 1(a)-1(d) including the size of the flat regions among the dome or dome-like structures. While not shown in FIGS. 1(a)-1(d), these flat regions may contain additional, smaller dome or dome-like features also which are positioned randomly or systematically among the protrusions of FIGS. 1(a)-1(d). Additionally, protrusion features and flat region features may (not shown) or may not be textured (random topology).

The nano-elements of dimensions h, d, and L as seen in FIGS. 1(a)-1(d), if present, are utilized to form the protrusions during deposition of the dome or dome-like features or layers thereof and may be made using vacuum or non-vacuum deposition steps such as molding, probe printing, and imprinting processing. Their formation does not require glass hard-mask etching. The dome or dome-like protrusion array and the metal-less reflector/electrode back contacts function with, or without, the presence of the nano-elements of FIGS. 1(a) and 1(b). As noted earlier, the key aspect of the metal-less reflector/back electrode invention disclosed herein is the refraction caused by the dome or dome-like features at the front surface and the absence of any optically functioning metal at the device back. The TCM layer or layers of the metal-less back reflector/electrode of this invention may utilize substrates such as metal foils, glass foils, and organic materials illustratively including polyacetylene, polyphenylene vinylene, polypyrrole, polythiophene, polyaniline, polyimide, or polyphenylene sulfide. The metal-less back reflector/electrode serves as the counter electrode to the front electrode which itself is the top layer of or is at least a part of the dome-like structures.

Figure 3:
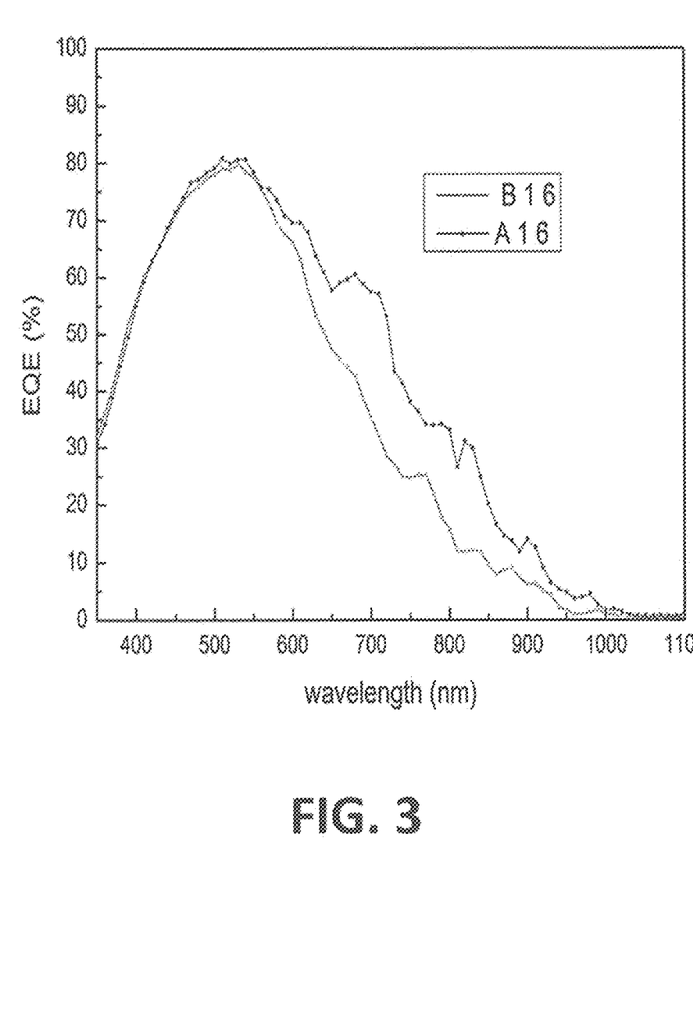
FIG. 3 is a plot of an experimental EQE for two solar cell structures, where both have domes on the front surface as seen in FIG. 1(a) but sample A16 has a metal-less AZO reflector/back electrode contact whereas sample B16 has a metal AZO/Cr reflector/back electrode contact, the response of sample A16 is seen to be superior to B16, especially in the red.

The metal-less reflector/back electrode structure of the invention disclosed herein performs very well as seen from Tables I and II and FIG. 3. The invention is seen from the description and FIGS. 1(a)-(d) and 2 to differ from the back contacts of Kim et al. in a number of aspects including: (1) The back contacts of Kim et al. are for superstrate devices; (2) the "none BR ZnO:Al [AZO] back contact" of Kim et al. is labeled a non-back reflector structure whereas in the innovative structure here a ZnO:Al [AZO] back contact would be specifically designed to function as a metal-less back reflector/electrode contact; (3) the refracting dome or dome-like structures of our invention are oriented to protrude away from the device absorber as seen in FIG. 1(a)-(d) whereas the corresponding refracting structures of Kim et al are protruding into the device absorber; (4) our metal-less reflector/back electrode back contacts do not necessitate A~2 and therefore mitigate against the possibility of performance degrading sharp features; (5) the important dimensions of our metal-less reflector/electrode back contacts are the D, H, and L of the periodic dome or dome-like features whereas they are the height and base of microcones for Kim et al.; (6) the boundaries of our structure defining the region to be filled with the active layer are smooth thereby also helping to avoid the sharp boundary problematic features possible in the back contacts of Kim et al.; (7) the nano-elements seen in FIGS. 1(a) and 1(b) correspond to the microcones of Kim et al. but are made using non-vacuum molding, probe printing, or imprinting processing and not glass hard-mask etching; (8) the metal-less reflector/electrode back contacts of this invention do not involve the use of nanoparticles and therefore do not involve the use of the concomitant nanoparticle application step; and (10), as seen in Table II, the metal-less reflector/back electrode contacts of this invention function essentially equally well with, or without, the presence of the nano-elements of FIGS. 1(a) and 1(b). As noted earlier, the key aspect of the metal-less reflector/back electrode invention disclosed here is the refraction caused by the protruding, periodic dome or dome-like features on the front surface and their optimal shape and index of refraction variations with successive layers.

Modeling results used in the study of and design of the metal-less reflector/back electrode of this invention are summarized in Table I for the case of a metal-less AZO back reflector/electrode contact and, for comparison, for several AZO/metal back reflector/electrode contacts using several types of metals. These comparisons are all done for cells for front surface dome cells using solar cell short circuit current Jsc results for nc-Si absorbers of 400 nm thickness. The fact that a metal-less R/EBC performs almost as well as silver is outstanding. Table II gives results for metal-less AZO back reflector/electrode contacts with nano-elements and without nano-elements. These results underscore the crucial role of the dome or dome-like structures of the front surface in metal-less reflector/electrode back contact devices. These results make it apparent that the nano-element principally plays a role in the fabrication process of shaping the dome or dome-like structures, if utilized.

Table 1. Jsc values for various metal reflector/electrode back contact cells and a metal-less cell—all with domes.

TABLE 1

Jsc for Various Metal Reflector/Electrode Back Contact Cells and a Metal-less Cell All with Domes (teff = 434 nm)

| Configuration | Jsc (mA/c㎡2) |
|---|---|
| Ag dome solar cell | 30.64 |
| Cr dome solar cell | 22.6 |
| Al dome solar cell | 25.71 |
| Au dome solar cell | 28.54 |
| Metal-less (AZO) dome solar cell | 28.7 |

TABLE 2

Metal-less AZO reflector/back electrode ncSi cells on polyimide.
Metal-less AZO reflector/back electrode ncSi cells on polyimide
(Absorber thickness t was 400 nm but this was reduced for the case when the nano-element was not present)

| configuration | On PI |
|---|---|
| AZO Metal-lesss | 29.53 mA/c㎡2) |
| AZO Metal-lessw/o nanoelement | 29.14 mA/c㎡2) |
| AZO metal-lessw/o nanoelement-teff adjusted | 29.08 mA/c㎡2) |

An experimental comparison of the performance of two dome substrate solar cell devices with metal-less reflector/back electrode back contacts (e.g., ZnO:Al back contacts) and metal reflector/back electrode back contacts (e.g., AZO/Ag back contacts) is presented in FIG. 3. Both have domes on the front surface implemented using the nano-elements of FIG. 1(a) but sample A16 has a metal-less AZO reflector/back electrode contact whereas sample B16 has a metal AZO/Cr reflector/back electrode contact. Chromium was employed here since it has high plasmonic losses in the wavelength region of interest. The red light response of sample A16 is seen to be superior due to the avoidance of plasmonic losses. These losses are present with the involvement of a metal (B16) as part of the back contact.

CITED REFERENCES (1) S. Fonash. Solar Cell Device Physics. Elsevier (2010)
(2) C. Ballif. *J. Appl. Phys.* 2009, 106, 044502.
(3) V. E. Ferry. A. Pullman, H. A. Atwater, *ACS Nano.* 2010, 5, 10055.
(4) Jeehwan Kim. Corsin Battaglia. Mathieu Charrière, Augustin Hong, Wooshik Jung, Hongsik Park, Christophe Ballif, and Devendra Sadana, Adv. Mater. 2014, 26, 4082.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the described embodiments in any way. Rather, the foregoing detailed description will provide those skilled in the art with a convenient road map for implementing the exemplary embodiment or exemplary embodiments. It should be understood that various changes can be made in the function and arrangement of elements without departing from the scope as set forth in the appended claims and the legal equivalents thereof.

The invention claimed is:

1. A photovoltaic or light detecting device comprising:
   a periodic array of dome or dome-like protrusions at a light impingement surface;
   an electrode following the contour of said periodic array of dome or dome-like protrusions;
   a back electrode also defining a metal-less reflector, said metal-less reflector and back electrode serving as the back light reflector and counter electrode to said periodic array of dome or dome-like protrusions, where said metal-less reflector and back electrode is planar and continuous under said periodic array of dome or dome-like protrusions, contains no metal layers, and is electrically conducting and devoid of any metal film having an optical function;
   an active region intermediate between said electrode and said metal-less reflector and back electrode;
   a planar substrate supporting said metal-less reflector and back electrode; and
   a metal layer forming a back contact on said planar substrate, said metal layer having no required or significant optical function as a reflector and serves only as a structural support, an electrical conduit, or a combination thereof.

2. The device of claim 1 wherein said device is a solar cell.

3. The device of claim 1 wherein said periodic array of dome or dome-like protrusions has a dome base dimension D that is essentially equal to L where L is the spacing in a hexagonal pattern.

4. The device of claim 1 wherein said active region has an active layer top surface that is at least partially in one of said periodic array of dome or dome-like protrusions and wherein a terminal protrusion layer before said active region has an optical frequency index of refraction n less than or essentially equal to that of said active region.

5. The device of claim 1 wherein said active region is planar with said periodic array of dome or dome-like protrusions disposed on said active region with said periodic array of dome or dome-like protrusions containing material that imparts activity to said active region and having an optical frequency index of refraction n less than or essentially equal to that of said active region.

6. The device of claim 1 wherein said periodic array of dome or dome-like protrusions contains nano-elements.

7. The device of claim 1 wherein said planar substrate supporting said metal-less reflector and back electrode comprises polyimide material.

8. The device of claim 1 wherein said planar substrate is an organic substrate which is formed of an organic material comprising: polyacetylene, polyphenylene vinylene, polypyrrole, polythiophene, polyaniline or polyphenylene sulfide.

9. The device of claim 4 wherein said planar substrate is an organic substrate.

10. The device of claim 4 wherein said planar substrate is an inorganic substrate.

11. The device of claim 4 wherein said planar substrate is a metallic substrate.

12. The device of claim 5 wherein said planar substrate is an organic substrate.

13. The device of claim 5 wherein said planar substrate is an inorganic substrate.

14. The device of claim 5 wherein said planar substrate is a metallic substrate.

* * * * *